United States Patent

Maige et al.

[11] Patent Number: 5,814,952
[45] Date of Patent: Sep. 29, 1998

[54] DEVICE FOR CORRECTING THE RAMP LINEARITY OF SAW-TOOTH SIGNALS

[75] Inventors: Philippe Maige, Seyssinet-Pariset; Nicolas Lebouleux, Grenoble; Gilles Troussel, Saint Martin d'Heres, all of France

[73] Assignee: SGS-Thomson Microelectronics S.A., Agrate Brianza, Italy

[21] Appl. No.: 697,405

[22] Filed: Aug. 23, 1996

[30] Foreign Application Priority Data

Aug. 24, 1995 [FR] France ................................... 95 10186

[51] Int. Cl.⁶ ............................... G09G 1/04; H01J 29/70; H03K 4/90
[52] U.S. Cl. ........................... 315/371; 315/403; 327/133
[58] Field of Search .................... 315/371, 403, 315/407, 410; 327/133, 132, 131

[56] References Cited

U.S. PATENT DOCUMENTS

| 4,031,411 | 6/1977 | Schat et al. ................................. 307/228 |
| 4,739,228 | 4/1988 | Viscardi et al. ............................ 314/408 |
| 4,855,651 | 8/1989 | Jobling ...................................... 315/403 |
| 4,887,011 | 12/1989 | Haynie ...................................... 315/403 |
| 4,972,127 | 11/1990 | Rodriguez-Cavazos et al. ....... 315/371 |
| 5,502,410 | 3/1996 | Dunn et al. ............................... 327/131 |

FOREIGN PATENT DOCUMENTS

A-42 39 666   6/1994   Germany .......................... H04N 3/23

OTHER PUBLICATIONS

French Search Report from French Patent Application No. 95 10186, filed Aug. 24, 1995.

Electronic Engineering, vol. 60, No. 744, Dec. 1988, pp. 25/26, 28, and 30, Ligertwood, P.J. "A Digitally Controlled Colous TV Chip With Integrated Video Filters".

Primary Examiner—Gregory C. Issing
Attorney, Agent, or Firm—Wolf, Greenfield & Sacks, P.C.

[57] ABSTRACT

A device for correcting the linearity of ramps of a saw-tooth signal provided across a capacitor, charged by a first current source and periodically discharged at a desired frequency. The device modulates the charging current of the capacitor by a correction current to render the ramps of the signal not linear. In addition, the device includes circuitry to render the correction current proportional to the current provided by the first current source.

31 Claims, 5 Drawing Sheets

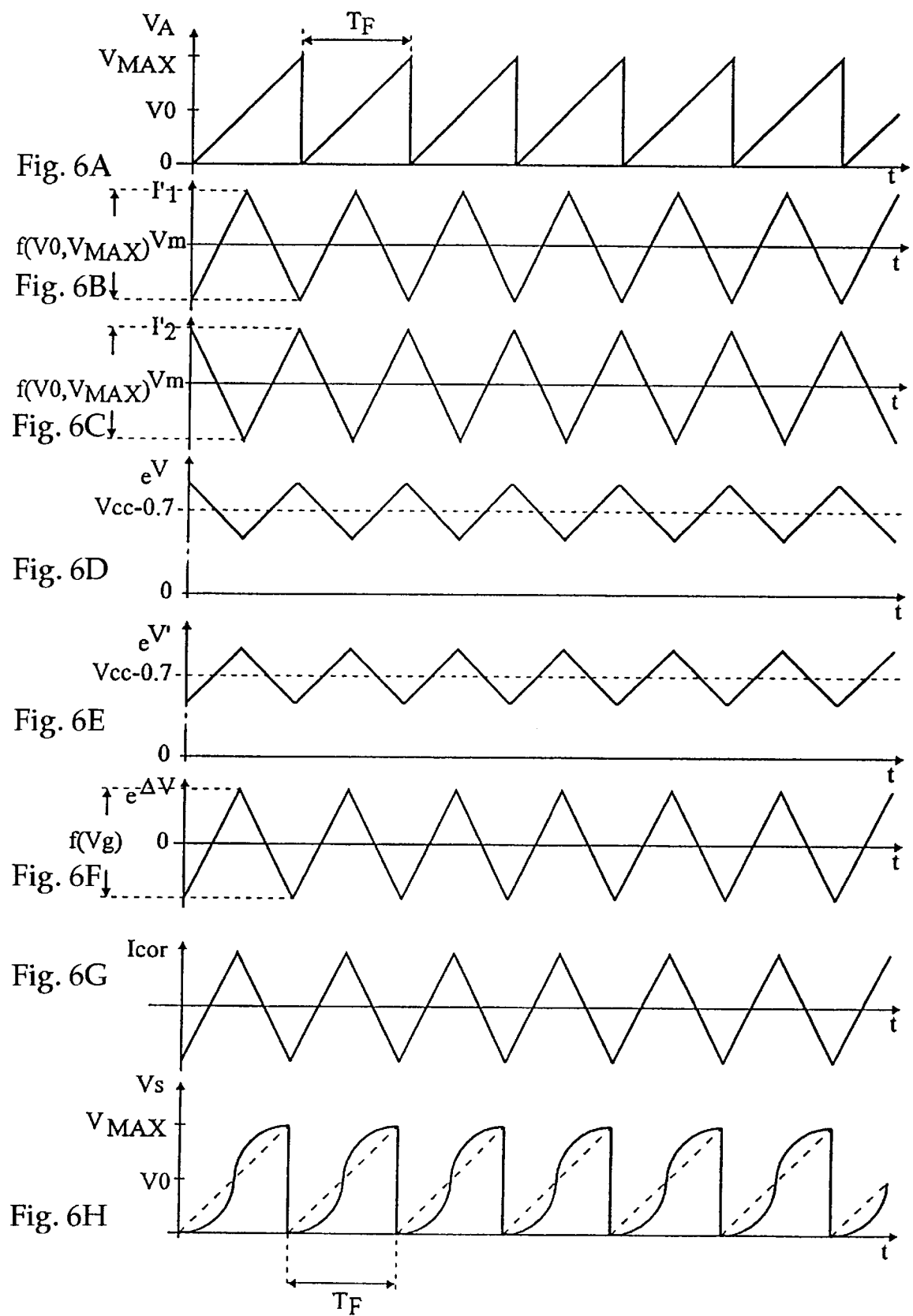

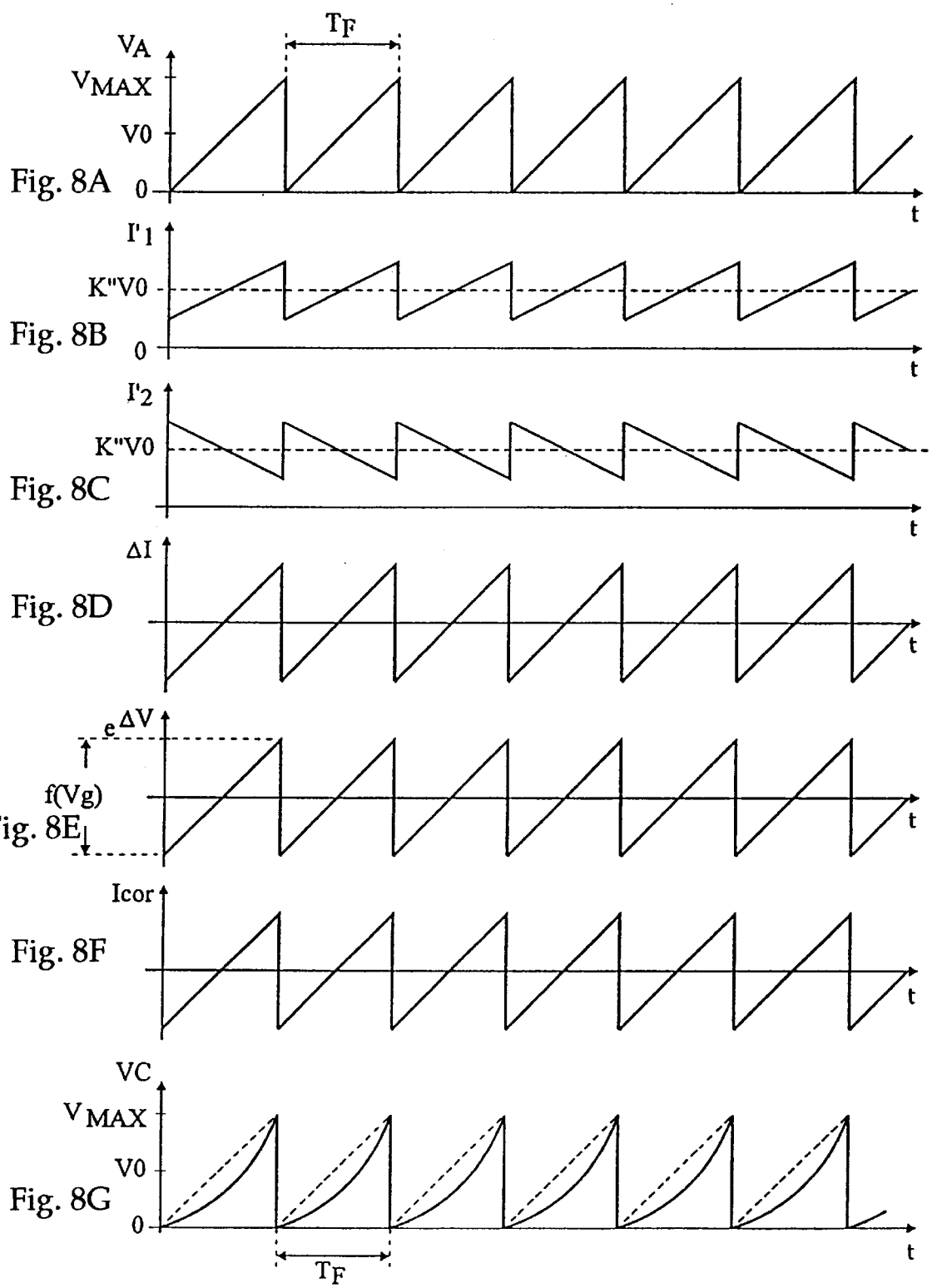

DEVICE FOR CORRECTING THE RAMP LINEARITY OF SAW-TOOTH SIGNALS

BACKGROUND OF THE INVENTION

1. Field of the Invention

The present invention relates to the fabrication of a generator of saw-tooth signals with non linear ramps. The invention more particularly applies to such a generator carrying out a vertical scanning linearity correction of a cathode ray tube and usable at different frequencies of the vertical scanning.

2. Discussion of the Related Art

The vertical scanning of a cathode ray tube is generally controlled by a saw-tooth signal whose frequency corresponds to the frequency of the picture frames. The saw-tooth signal controls the vertical deflection of the electron beam. Because of the non-spherical curvature of the screen and non-linearity of the electron gun, the ramp of the saw-tooth should be corrected so that images are suitably displayed. The correction consists of deforming the linear ramps of a saw-tooth signal as a function of the cathode ray tube, which renders the ramps non-linear. In other words, the current ramps for controlling the vertical deflection of the electron beam are modulated as a function of the flatness of the screen and of the linearity of the electron gun.

FIGS. 1A–1D are time diagrams showing the waveform of a saw-tooth signal before correction and the deformations applied to the ramps of the saw-tooth signal to obtain a signal for controlling the vertical deflection of the electron beam. The frequency of the signals represented in FIGS. 1A–1D corresponds to the frequency of the picture frames, i.e., to the frequency of the vertical screen scanning. For the sake of clarity, the time diagrams are not drawn to scale.

FIG. 1A represents a saw-tooth signal with linear ramps between a zero voltage and a maximum value $V_{MAX}$ of the scanning control voltage $V_D$. The rising time $T_F$ of each ramp corresponds to the vertical scanning period.

FIGS. 1B and 1C represent two types of deformations of the signal of FIG. 1A.

There are two types of corrections. A first so-called "C" correction ($V_C$ in FIG. 1B), compensates for the non-linearity of the electron gun. The C correction imparts to the ramps a concave or convex curvature. In the represented example, the electron gun is assumed to saturate for small deflection angles of the beam.

A second so-called "S" correction ($V_S$ in FIG. 1C) takes into account the screen curvature. For a substantially flat screen, the scanning at the vertical ends of the images should be slowed to obtain a correct image. This amounts to imparting to the saw-tooth a smaller ramp at its ends. The S correction imparts to the ramps an S-shaped curvature crossing the linear ramp (drawn in dotted lines in FIGS. 1B–1D) at mid-height, i.e., at a voltage $V_0$ corresponding to the mean voltage between the maximum voltage $V_{MAX}$ and minimum voltage (here, ground) of the signal.

As shown in FIG. 1D, both C and S corrections are combined (superposed) to provide signal $V_B$ for controlling the screen vertical scanning. This superposition shifts the intersection of the S corrected ramp with the linear ramp, either downward, as represented in FIG. 1D, or upward, as a function of the concave or convex shape of the C correction, and modifies the antinodes of the S-shaped ramps.

The correction characteristics, C and S respectively, to apply to the vertical scanning control signal are provided by the manufacturers of cathode ray tubes. However, a same tube can be used at different scanning frequencies (for example 50 Hz, 60 Hz or 100 Hz).

A linear saw-tooth signal $V_D$ is generally obtained with a current source that charges a capacitor. The capacitor is discharged at the frame frequency. Voltage $V_D$, present across the capacitor, is then a linear saw-tooth signal.

FIG. 2 represents a conventional exemplary saw-tooth generator using a capacitor. A current source 1 provides a charging current I, at a first terminal A of a capacitor $C_1$ whose other terminal is connected to ground. A switch 2 is connected between terminal A and ground to discharge capacitor $C_1$. Switch 2 is controlled by a clock signal FS at the frame frequency. The saw-tooth signal is drawn at terminal A as a voltage $V_A$.

In the absence of other elements, voltage $V_A$ of terminal A corresponds to a linear saw-tooth signal VD, as represented in FIG. 1A.

Various solutions are conventionally used to modulate the ramps of saw-tooth signals. The S and/or C correction is achieved either from voltage $V_A$ or by modulating the charging current of capacitor $C_1$ by providing an additional correction current $I_{cor}$ to terminal A.

A first solution (not shown) consists of transmitting voltage $V_A$, drawn across capacitor $C_1$, to a non-linear amplifier which deforms the ramps at their ends through saturation phenomenon. This solution only applies to the C correction and its drawback is that it cannot be adjusted. In other words, the non-linear amplifier is definitively sized depending upon the C correction to be achieved and of the frequency of the vertical scanning.

A second solution (not shown) consists of generating, through an output amplifier receiving voltage $V_A$ and a reference voltage, a parabola related to the C correction. Although such a solution allows the adjustment of amplitude of the saw-tooth signal independently of the vertical scanning frequency by the reference voltage, it has the drawback of being empirical and difficult to adjust to the scanning frequency. Indeed, the feedback of the output amplifier includes discrete components (coils, capacitors, resistors) that must be adjusted as a function of the scanning frequency. This requires the use of discrete components, which impairs the integration of the circuit. The adjustment of the discrete components is conventionally achieved by potentiometers and is very difficult if the S and C corrections are achieved by the same circuit.

A third solution for the S correction consists of modulating the charging current of capacitor $C_1$. The modulation is achieved by providing, to terminal A, a trapezoidal-shaped correction current $I_{cor}$ having a zero mean value, which amounts to charging capacitor $C_1$ no longer with a constant current but with a variable current.

In practice, a correction voltage $V_{cor}$ is generated and applied to a first terminal of a capacitor whose other terminal is connected to terminal A and, through a resistor, to ground. The coupling necessary for the modulation of the charging current is achieved with discrete components (resistors, capacitors) outside the circuit. The use of discrete components, between the output of the second current source and terminal A, is necessary because of the high value (approximately 1 μF for a cut-off frequency of a few Hertz) of the coupling capacitor. In addition, it is difficult to determine the size of the capacitor and resistor to obtain a frequency and amplitude operating point corresponding to the desired scanning frequency and amplitude for correction. Further, in addition to the difficulty of adjusting the discrete components, another drawback of such a circuit is that the amplitude of the correction signal varies as a function of the scanning frequency.

To enable the adjustment of the amplitude of the correction current, a circuit as represented in FIG. 3 can be used. The correction voltage $V_{cor}$ is obtained by a feedback loop including a second current source. Voltage $V_A$ is provided to a correction device 3 which provides, at terminal A, the correction current $I_{cor}$ which modulates the charge of capacitor $C_1$ (not shown in FIG. 3). Voltage $V_A$ is provided to a rectifier 4 having differential outputs with respect to a reference voltage $V_{ref}$. The outputs of rectifier 4 are provided to a multiplier for adjusting the amplitude of the correction signal. The multiplier is, for example, formed by two bipolar transistors $T_1$ and $T_2$, each receiving at their base one of the differential outputs of rectifier 4. The collectors of transistors $T_1$ and $T_2$ are connected to ground through resistors $R_1$ and $R_2$. The emitters of transistors $T_1$ and $T_2$ are connected to a second adjustable current source 5. The adjustment of the current source 5 determines the amplitude of the multiplier's output signal. Two additional resistors $R_3$ and $R_4$ are connected in series between the supply voltage $V_{cc}$ and ground to form a voltage dividing bridge with resistor $R_2$. The output of device 3 is drawn between resistors $R_3$ and $R_4$ as a correction voltage $V_{cor}$. Device 3 is then coupled to the current source 1 (FIG. 1) to modulate the charging current of capacitor $C_1$ by the correction current $I_{cor}$. This coupling is, as above, achieved by a capacitor $C_2$ and a resistor $R_5$ that are connected in series between the output of device 3 and ground. The correction current $I_{cor}$ is drawn between capacitor $C_2$ and resistor $R_5$ and is provided to terminal A.

Although such a correction device 3 allows the adjustment of the amplitude of the correction signal, it still requires the use of discrete components (capacitor $C_2$ and resistor $R_5$) which should be adjustable to enable operation at various scanning frequencies, because the values of capacitor $C_2$ and resistor $R_5$ must be adjusted as a function of the scanning frequency. The correction device 3 is generally integrated in the same circuit as that including the current source 1. Thus, such a conventional integrated circuit requires two terminals. A first terminal constitutes an output terminal of device 3 for the coupling of capacitor $C_2$ and a second terminal constitutes an access terminal to terminal A.

A drawback of conventional circuits is that they require the use of discrete components external to the circuit if their frequency or amplitude must be adjusted.

A drawback of discrete components is that the change over time of the values of these components causes an unsetting of the corrections and deformation of pictures.

SUMMARY OF THE INVENTION

An object of the present invention is to provide a saw-tooth signal generator with non-linear ramps which can be fully integrable.

A further object of the present invention is to provide a device for correcting the linearity of ramps of a saw-tooth signal which can be automatically adapted to the amplitude of the saw-tooth.

A further object of the present invention is to provide a device for correcting a saw-tooth signal which is self-adaptable to the signal frequency.

A further object of the present invention is to provide a generator for generating a saw-tooth signal which enables an S and/or a C correction.

A still further object of the present invention is to provide a generator that is adjustable in a simple way.

To achieve these objects, the present invention provides a device for correcting the linearity of ramps of a saw-tooth signal provided across a capacitor, charged by a first current source and periodically discharged at the desired frequency, including means for modulating the charging current of the capacitor by a correction current so as to render the ramps of the signal not linear, and means for rendering the correction current proportional to the current provided by the first current source.

According to an embodiment of the invention, the correction device includes a transconductance amplifier receiving a differential voltage representative of the correction to be achieved and providing the correction current, the amplifier being biased by a second current source connected as a current mirror to the first source.

According to an embodiment of the invention, the differential voltage is obtained from two voltages referenced to a positive supply voltage of the device.

According to an embodiment of the present invention, the bias current of the amplifier corresponds to the current provided by the first current source having a positive coefficient.

According to an embodiment of the present invention, the correction device includes a differential multiplier for providing the differential voltage, as a function of a gain reference value to be applied to two differential inputs receiving currents from an input stage which receives the voltage across the capacitor.

According to an embodiment of the present invention, the gain reference value is provided to the multiplier as two d.c. currents from a voltage-to-current converter receiving a gain reference voltage.

According to an embodiment of the present invention, the input stage further receives two control voltages, for the amplitude and the mean voltage of the saw tooth, respectively, and is formed by a rectifier and a voltage-to-current converter with differential outputs.

According to an embodiment of the present invention, the input stage further receives a medium reference voltage of the saw-tooth, and is formed by a voltage-to-current converter with differential outputs.

According to an embodiment of the present invention, the correction device is used for the correction of the linearity of vertical scanning of a cathode ray tube.

The invention also relates to a saw-tooth generator for generating signals with non-linear ramps including a first current source for charging a capacitor that is discharged at the desired frequency for the signal provided across the capacitor and at least one device for correcting the ramp linearity.

The foregoing and other objects, features, aspects and advantages of the invention will become apparent from the following detailed description of the present invention when taken in conjunction with the accompanying drawings.

BRIEF DESCRIPTION OF THE DRAWINGS

FIGS. 6A–6H represents time diagrams of the waveforms of various signals of a generator such as represented in FIG. 5;

FIGS. 8A–8G represents time diagrams of the waveform of various signals of a generator including a C correction device according to the invention.

For the sake of clarity, the same elements are designated with the same references in the various figures. Similarly, the time diagrams of FIGS. 6 and 8 are not drawn to scale.

DETAILED DESCRIPTION

According to the invention, the modulation of a capacitor's charging current used to generate a saw-tooth signal is achieved by a correction current whose amplitude and frequency are automatically adjusted with the desired amplitude and frequency of the saw-tooth signal with non-linear ramps.

Figure 4:
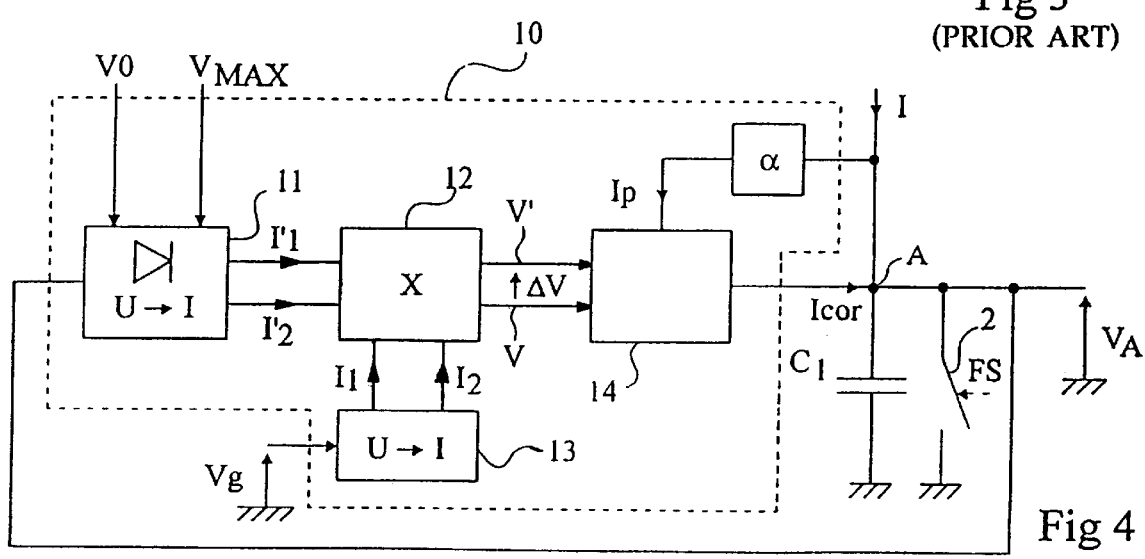
FIG. 4 is a functional diagram of an embodiment of a generator according to the invention applied to an S correction of a saw-tooth signal.

FIG. 4 is a functional diagram of an embodiment of a saw-tooth generator for generating a signal with non-linear ramps with an S correction device according to the invention.

As above, the saw-tooth signal is generated by a current source which charges a capacitor $C_1$. Capacitor $C_1$ is discharged at the frequency of the picture frames by a switch 2 controlled by a signal FS at the desired vertical scanning frequency. The current source (not shown in FIG. 4) provides a current I to charge terminal A of capacitor $C_1$.

According to the invention, voltage $V_A$ is provided at an input stage 11 of a correction device 10 for generating a correction current $I_{cor}$ at terminal A to modulate the charging current of capacitor $C_1$. The input stage 11 receives voltage $V_A$ and at least one reference value related to the desired amplitude of the saw-tooth signal.

For an S correction, input stage 11 receives two reference values corresponding to voltages, $V_{MAX}$ and $V_0$, respectively, which represent the maximum voltage $V_{MAX}$ of the saw-tooth signal and the mean voltage $V_0$ of a saw-tooth.

Still for an S correction, input stage 11 is a rectifier with two differential outputs, $I'_1$ and $I'_2$, respectively. The role of stage 11 is to rectify the saw-tooth signal that it receives as a voltage $V_A$ and to convert it into two differential currents $I'_1$ and $I'_2$, respectively, whose difference $\Delta I$ has a zero mean value. The difference $\Delta I$ between currents $I'_1$ and $I'_2$ depends upon voltages $V_A$, $V_0$ and $V_{MAX}$. The relation between currents $I'_1$ and $I'_2$ is expressed by:

$$\Delta I = I'_1 - I'_2 = (K/2)*(V_{MAX}-V_0) + K^**(V_0-V_A)*sgn(V_A-V_0),$$

where K is a conductance constant of stage 11 and $sgn(V_A-V_0)$ is the sign of the difference between voltage $V_A$ and voltage $V_0$.

Input stage 11 is followed by a differential multiplier 12. Multiplier 12 adjusts the S correction with respect to the characteristics of the cathode ray tube. For this purpose, multiplier 12 receives two differential currents $I_1$ and $I_2$ from a voltage-to-current converter 13 which receives a gain reference value $V_g$. The gain reference voltage $V_g$ is determined as a function of the characteristics of the S correction of the cathode ray tube, i.e., voltage $V_g$ adjusts the antinodes of the S correction.

The difference between currents $I_1$ and $I_2$ is proportional to the reference voltage $V_g$, i.e., $I_1-I_2=K'V_g$, where K' is a conductance constant of converter 13. Currents $I_1$ and $I_2$ are d.c. currents provided that voltage $V_g$ is adjusted to a predetermined value, which is determined as a function of the characteristics of the S correction to be applied to the vertical scanning. Converter 13 is also used to bias the differential multiplier 12 by currents $I_1$ and $I_2$.

Multiplier 12 provides a differential voltage $\Delta V = V'-V$. This differential voltage is, according to the invention, applied to a transconductance amplifier 14 which provides the correction current $I_{cor}$ at terminal A.

Figure 2:
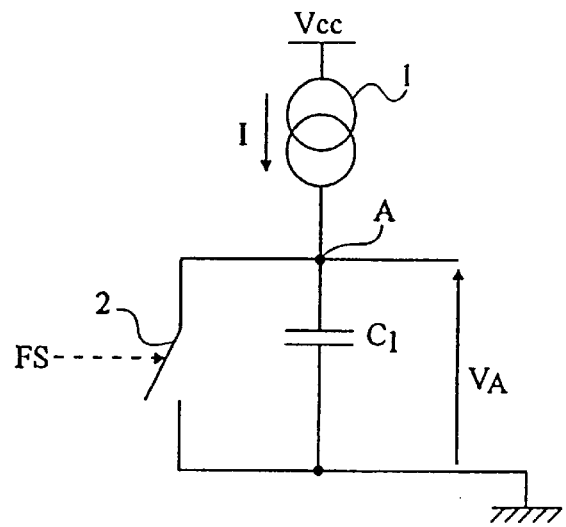
Figure 3:
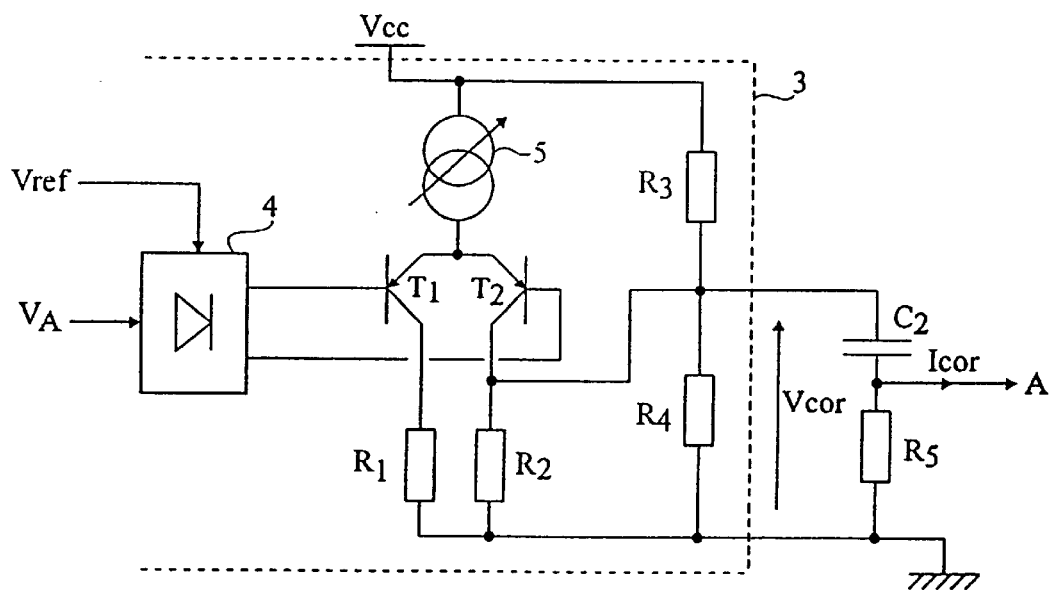

A feature of the present invention is that amplifier 14 is biased as a function of the current provided from the current source 1 (FIG. 2) to charge capacitor $C_1$. In other words, the bias current $I_p$ of amplifier 14 corresponds to current I, preferably multiplied by a positive coefficient $\alpha$.

Thus, the correction current $I_{cor}$ is proportional to current I and to voltage $\Delta V$. The relation between current $I_{cor}$ and current I can be written:

$$I_{cor} = \alpha * I * \Delta V / 2V_T,$$

where $V_T$ is the threshold voltage of a bipolar transistor, i.e., approximately 26 mV at room temperature.

Thus, the correction current $I_{cor}$ can be written:

$$I_{cor} = k*I*V_g*\{[(V_{MAX}-V_0)/2]+[(V_0-V_A)*sgn(V_A-V_0)]\},$$

where k is a constant depending upon K, K', $\alpha$ and $V_T$.

Another feature of the present invention is that the frequency of the correction current $I_{cor}$ is automatically adjusted by the scanning frequency. The frequency of the trapezoidal signals provided by rectifier 11 corresponds to the frequency of the saw-tooth of signal $V_A$. Since the differential currents $I_1$ and $I_2$ for adjusting the gain are d.c. currents, voltages V and V', and therefore current $I_{cor}$, have the same frequency as the saw-tooth signal.

Figure 5:
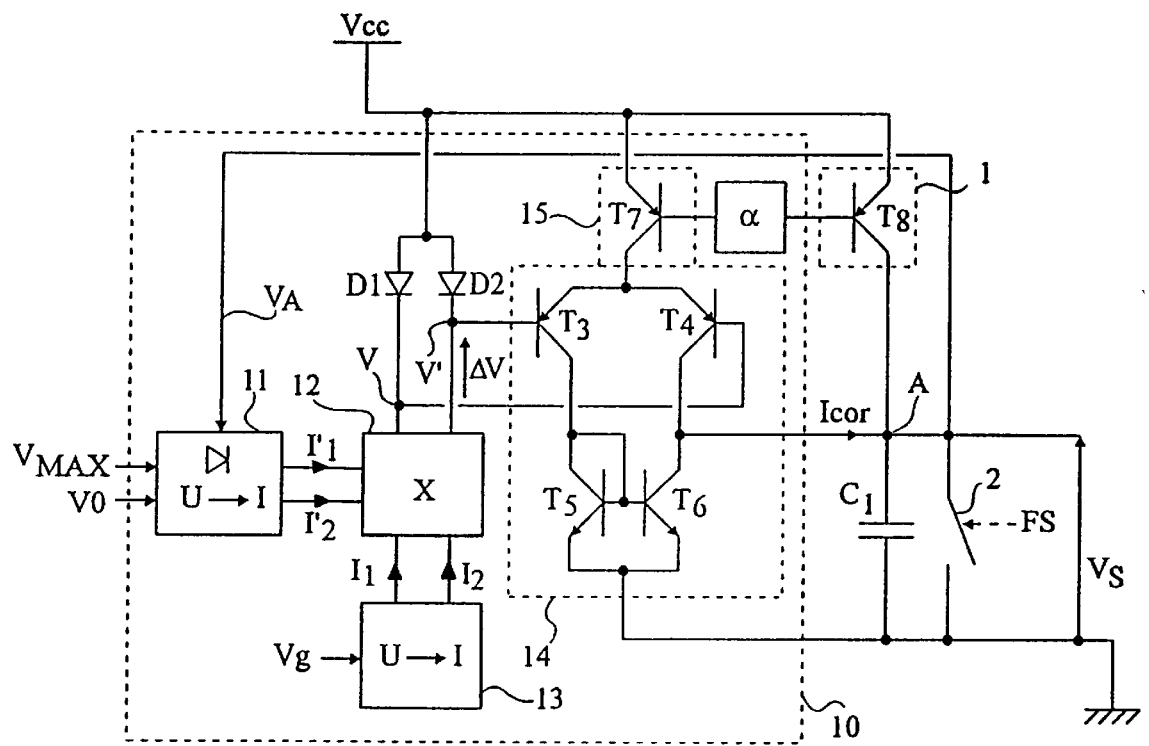
FIG. 5 represents an embodiment of a generator according to the invention applied to an S correction of a saw-tooth signal.

FIG. 5 is a block diagram of an embodiment of a generator for generating a saw-tooth with non-linear ramps according to the invention. The description of the circuit of FIG. 5 will be made with relation to FIG. 6 which shows time diagrams of exemplary waveforms of signals $V_A$, $I'_1$, $I'_2$, V, V', $\Delta V$, $I_{cor}$ and $V_S$.

For the sake of clarity, it is assumed in FIG. 6 that the correction is not effectively achieved, i.e., signal $V_A$ is represented as a saw-tooth with a linear ramp. In practice, the waveform of signal $V_A$ is similar to that of signal $V_S$ of FIG. 1D because the S correction is achieved by current $I_{cor}$.

Currents $I'_1$ and $I'_2$ result from the rectification of voltage $V_A$. Considering values $V_0$ and $V_{MAX}$ that are provided, as reference values, to rectifier 11, the difference $(I'_1-I'_2)$ between currents $I'_1$ and $I'_2$ has a zero mean value. The practical implementation of rectifier 11 is conventional. Currents $I'_1$ and $I'_2$ have the same mean value Vm. The mean value Vm depends upon the structure of the multiplier that is used. For example, if multiplier 12 is a simple quadrant multiplier, care should be taken that the mean value Vm of each current $I'_1$ and $I'_2$ is positive and higher than the half-amplitude of current $I'_1$ or $I'_2$. If multiplier 12 is of the two quadrants type, the mean value Vm of each current $I'_1$ and $I'_2$ can be arbitrary provided that it remains the same for both currents $I'_1$ and $I'_2$.

A yet another feature of the present invention is that the differential voltage $\Delta V$ provided by multiplier 12 is referenced with respect to the positive voltage $V_{cc}$ supplying the circuit. For this purpose, the current sources necessary for the operation of multiplier 12 are contained in converter 13 and the differential outputs of multiplier 12 are connected to the cathodes of diodes $D_1$ and $D_2$, respectively, having their anodes connected to the supply voltage $V_{cc}$.

Therefore, voltages V and V' result from a logarithmic compression of the product of the currents. To simplify, FIG. 6 shows the waveform of the exponential of voltages V, V' and ΔV. The exponential of voltages V and V', respectively, has a trapezoidal waveform similar to that of currents I'$_1$ and I'$_2$, respectively. The mean values of the exponentials of voltages V and V' correspond to the supply voltage V$_{cc}$ decreased at least by the PN junction voltage of diodes D$_1$ and D$_2$, respectively, i.e., approximately V$_{cc}$−0.7 volt. The amplitude of the variations of voltages V and V' mainly depends upon the value of the reference voltage V$_g$ provided to converter 13.

The exponential of the differential voltage ΔV also has a general trapezoidal waveform with however a mean zero value. Voltage ΔV increases during each first half-period of a period TF of the scanning frequency and decreases during the second half-period. The amplitude of voltage ΔV mainly depends upon the value of the reference voltage Vg.

In the embodiment shown in FIG. 5, the transconductance amplifier 14 comprises four bipolar transistors. Two input transistors T$_3$ and T$_4$, respectively, receive voltages V' and V at their respective bases. The collectors of transistors T$_3$ and T$_4$ are connected to the collectors of two other transistors T$_5$ and T$_6$, respectively, which have their emitters connected to ground. Transistor T$_5$ is mirror-connected to transistor T$_6$. The bases of transistors T$_5$ and T$_6$ are therefore connected to the collector of transistor T$_5$. The collector of transistor T$_4$ forms the output of amplifier 14 which provides current I$_{cor}$.

A feature of the present invention is that the emitters of transistors T$_3$ and T$_4$ are connected to the collector of a bipolar transistor T$_7$ forming a current source 15 that is mirror-connected with the current source 1. Current source 1 is, for example, formed by a bipolar transistor T$_8$ having its emitter connected to the supply voltage V$_{cc}$, its collector connected to terminal A and its base connected to the base of transistor T$_7$. The emitter of transistor T$_7$ is connected to the supply voltage V$_{cc}$. The proportion coefficient α between the current sources 1 and 15 can be obtained, for example, by the ratio of the emitter surface areas of transistors T$_7$ and T$_8$.

Thus, the correction current I$_{cor}$ provided by amplifier 14 is rendered dependent upon the value of current I. In this way, it is ensured that the amplitude of the correction current I$_{cor}$ follows the variations of the scanning frequency. Thus, the amplitude of the saw-tooth signal with non-linear ramps is not modified by a variation of the scanning frequency.

Current I$_{cor}$ has the same waveform as the exponential of the differential voltage ΔV, because amplifier 14 restores the trapezoidal waveform of the currents, provided that its input stage is formed by bipolar transistors T$_3$ and T$_4$ that are connected by their respective base. The amplitude of current I$_{cor}$ also depends upon value a in addition to values V$_0$, V$_{MAX}$ and V$_g$.

The adjustment of a generator, as represented in FIG. 5, is achieved, according to the invention, only through the reference voltages V0, V$_{MAX}$ and V$_g$. Voltages V$_{MAX}$ and V$_0$, determine the amplitude and the mean voltage of the saw-tooth signal, while voltage V$_g$ determines the deformation of the ramps, i.e., the antinode depth of the S correction.

The multiplying coefficient α is selected as a function of the range of values of the bias currents of multiplier 12. Since the bias currents correspond to currents I$_1$ and I$_2$, α is selected as a function of the desired adjustment range for the correction device 10. By way of example, α may range from 1 to 10.

An advantage of the present invention is that the correction device no longer requires discrete components.

The frequency operation range of a generator according to the present invention, for application to the correction of the vertical scanning of an electron gun of a cathode ray tube, is not limited by the value of capacitor C$_1$, because the low value of capacitor C$_1$ allows scanning frequencies of approximately several hundred Hertz (for example ranging from 50 Hz to 300 Hz).

A further advantage of the present invention is that the generator can be entirely adjusted by reference voltages, that may be digitally obtained.

Figure 7:
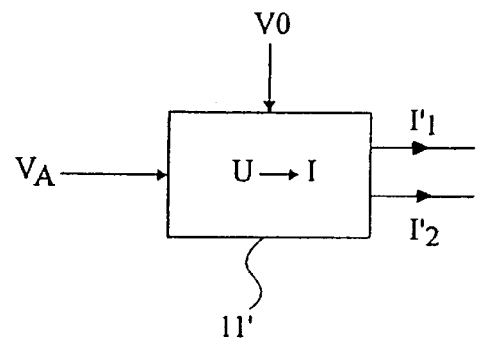
FIG. 7 represents an embodiment of an input stage of a correction device according to the invention applied to a C correction of a saw-tooth signal.

FIG. 7 represents an embodiment of an input stage 11' of a correction device according to the present invention for a C correction.

A feature of the present invention is that the correction device can be used for an S or C correction by modifying only the input stage receiving voltage V$_A$ and providing the two differential currents I'$_1$ and I'$_2$.

As represented in FIG. 7, the input stage 11' for a C correction is formed by a stage with differential outputs converting voltage V$_A$ into two currents I'$_1$ and I'$_2$. As a reference value, converter 11' receives voltage V$_0$ representing the mean voltage of the desired amplitude for the saw-tooth.

The difference ΔI between the two currents I'$_1$ and I'$_2$ is then:

$$\Delta I = I'_1 - I'_2 = K''*(V_A - V_0),$$

where K" is a conductance constant of converter 11'.

Since the other components constituting the correction device are not modified, the relation between current I$_{cor}$ and I can be written:

$$I_{cor} = k'*I*V_g*(V_A - V_0),$$

where k' is, as above, a constant depending upon the values of K", K', V$_T$ and α.

FIG. 8 illustrates the operation of a C correction device according to the present invention and represents in the form of time diagrams the waveforms of signals V$_A$, I'$_1$, I'$_2$, ΔI, I$_{cor}$, V$_C$ and of the exponential of signal ΔV.

As in FIG. 7, it is considered, for the sake of clarity, that the input voltage of converter 11' is a linear ramp. In practice, voltage V$_A$ has a waveform similar to that of voltage V$_C$.

Figure 1A:
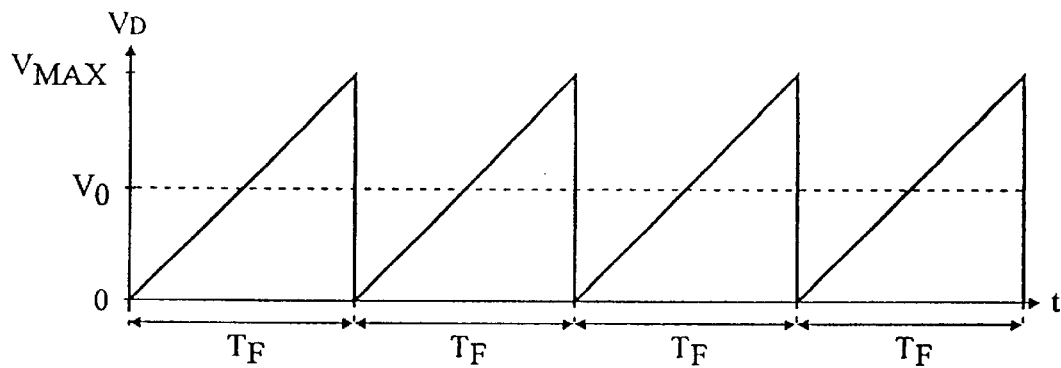
FIGS. 1a–1d, 2 and 3, above described, explain the state of the related art and the problem encountered.
Figure 1B:
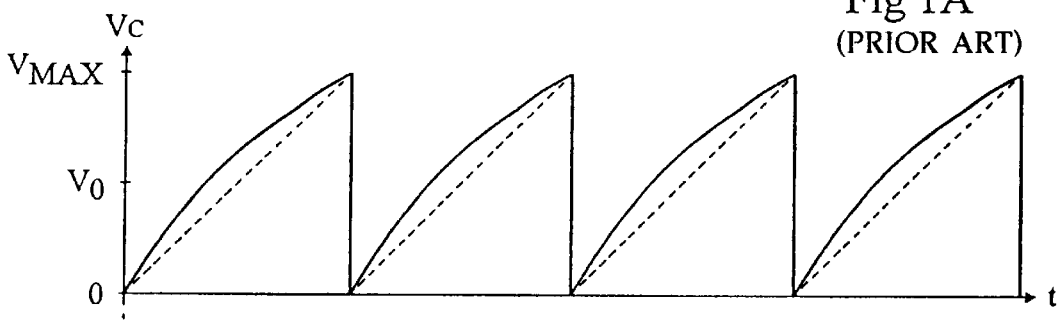
Figure 1C:
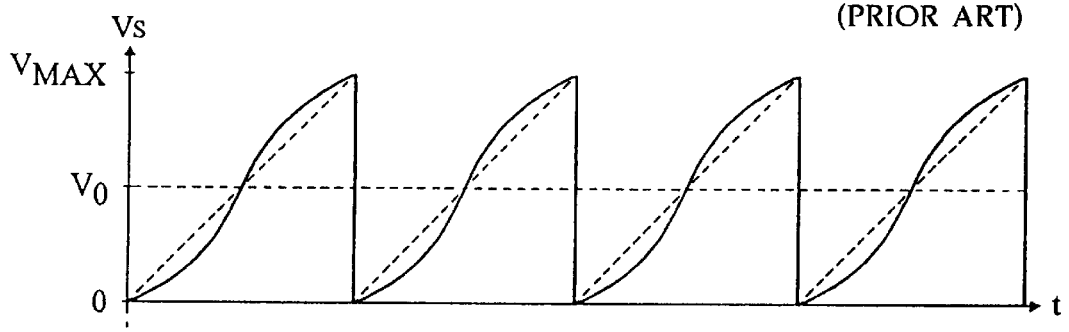

In this case, the function of the correction current I$_{cor}$ is to decrease the slope of the ramp during the first half-period of the scanning period T$_F$ and to increase this slope during the second half-period. In the example represented in FIG. 8, it is assumed that the electron gun saturates when the deflection angle of the beam is high. Here, the reference voltage V$_g$ is positive. For a gun that saturates when the deflection angle is small and to obtain a signal V$_C$ as represented in FIG. 1B, the reference voltage V$_g$ is negative. This causes the differential voltage ΔV to be inverted and thus the slope of the ramp to be increased during the first half-period and to be decreased during the second half-period.

It should be noted that the saw-tooth signal is not necessarily between 0 volt and V$_{MAX}$, because the correction device according to the invention applies independently of the minimum value of the saw-tooth signal voltage. The minimum value V$_{min}$ is determined by the voltage, here ground, to which capacitor C1 is connected and the emitters of transistors T$_5$ and T$_6$. Voltage V$_0$ representing the mean voltage of the saw-tooth signal is then (V$_{MAX}$−V$_{min}$)/2.

Figure 1D:
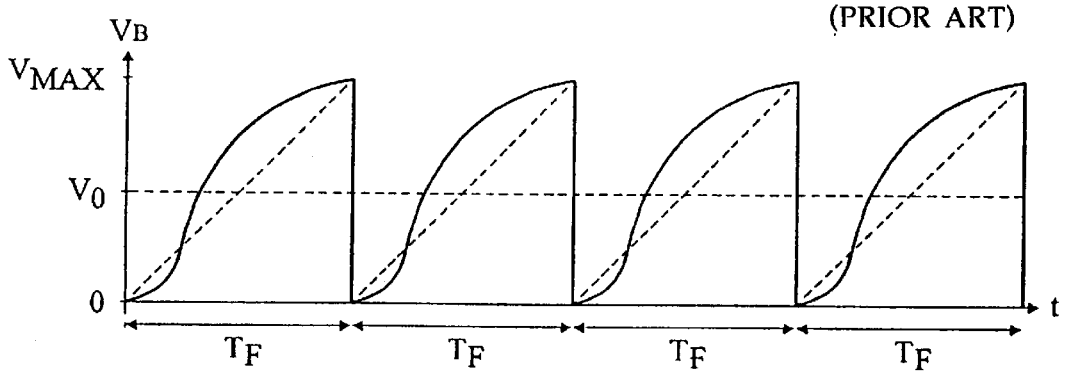

To carry out an S and C correction and to obtain a signal V$_B$ such as represented in FIG. 1D, two S and C correction devices, respectively, are used according to the present invention, each providing a correction current to terminal A. It is also possible to use a single device 10 having an input stage 11 for an S correction and to add an adjustable d.c. component to the two differential outputs I'$_1$ and I'$_2$ of rectifier 11 in order to impart a C correction function to device 10. However, it is advantageous to use two distinct devices to avoid the adjustment of the d.c. component to be added to currents I'$_1$ and I'$_2$ and to maintain the adjustment that is only achieved by reference voltages.

The practical implementation of the input stage 11, or 11', of multiplier 12 and converter 13 can be achieved by those skilled in the art in view of the above functional descriptions.

As is apparent to those skilled in the art, various modifications can be made to the above disclosed preferred embodiments. In particular, each of the described components can be replaced with one or more elements having the same function.

Having thus described at least one illustrative embodiment of the present invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A device for correcting a ramp of a saw-tooth signal provided across a capacitor charged by a charging current provided by a first current source and periodically discharged at a desired frequency, the correcting device including means for modulating the charging current of the capacitor by a correction current to render the ramp of the saw-tooth signal non-linear, the correction current being proportional to the charging current provided by the first current source, and a transconductance amplifier receiving a differential voltage representative of a correction to be achieved and providing said correction current, said amplifier being biased by a second current source connected as a current mirror with the first current source.

2. The device of claim 1, wherein the differential voltage is obtained from two voltages referenced to a positive supply voltage of the device.

3. The device of claim 1, wherein a bias current of the amplifier corresponds to the charging current provided by the first current source multiplied by a positive coefficient.

4. The device of claim 1, including a differential multiplier for providing the differential voltage, as a function of a gain reference value and two differential currents provided by an input stage which receives the saw-tooth signal across the capacitor.

5. The device of claim 4, wherein the gain reference value is provided to the multiplier as two d.c. currents from a voltage-to-current converter as a function of a received gain reference voltage.

6. The device of claim 5, wherein the input stage further receives a first control voltage proportional to a maximum amplitude value of the saw-tooth signal and a second control voltage proportional to a mean value of the saw-tooth signal, the input stage including a rectifier and a voltage-to-current converter with differential outputs.

7. The device of claim 5, wherein the input stage further receives a mean reference control voltage wherein the input stage includes a voltage-to-current converter with differential outputs.

8. The device of claim 1, applied to a correction of linearity of a vertical scanning signal of a cathode ray tube.

9. A generator for generating a saw-tooth signal with a non-linear ramp, the generator including a first current source for charging a capacitor that is discharged at a desired frequency of the saw-tooth signal provided across the capacitor and at least one device for correcting the ramp non-linearity of the saw-tooth signal, the at least one device comprising:

means for modulating the charging current of the capacitor by a correction current to render the ramp of the saw-tooth signal non-linear, the correction current being proportional to the charging current provided by the first current source, and a transconductance amplifier receiving a differential voltage representative of a correction to be achieved and providing said correction current, wherein said amplifier is biased by a second current source connected as a current mirror with the first current source.

10. A device to correct a ramp of a saw-tooth signal on a capacitor, the device comprising:

a first voltage-to-current converter to receive the saw-tooth signal and output first and second differential currents as a function thereof, a difference between the first and second differential currents having a mean value of zero;

a second voltage-to-current converter to receive a predetermined reference voltage and to output third and fourth differential currents as a function thereof, a difference between the third and fourth differential currents being proportional to the predetermined reference voltage;

a differential multiplier to receive the first, second, third and fourth differential currents and output a differential voltage as a function thereof; and a transconductance amplifier to receive the differential voltage and output a correction current to correct the ramp of the saw-tooth signal.

11. The device as recited in claim 10, wherein the rectifier receives a first correction reference signal proportional to a mean value of the saw-tooth signal, the first and second differential currents being a function thereof.

12. The device as recited in claim 11, wherein the rectifier receives a second correction reference signal proportional to a maximum amplitude value of the saw-tooth signal, the first and second differential currents being a function thereof.

13. The device as recited in claim 10, wherein the capacitor is charged by a charging current provided by a current source, the device further comprising:

a bias current circuit to supply a bias current to the transconductance amplifier as a function of the charging current supplied to the capacitor.

14. The device as recited in claim 13, wherein the bias current supplied to the transconductance amplifier by the bias current circuit is a function of the charging current multiplied by a positive coefficient.

15. The device as recited in claim 13, wherein the current source includes a first bipolar transistor, and wherein the bias current circuit comprises:

a second bipolar transistor mirror-connected with the first bipolar transistor, an emitter of the second bipolar transistor coupled to a positive supply voltage.

16. The device as recited in claim 15, wherein the transconductance amplifier comprises:

a third bipolar transistor having a base, an emitter and a collector, the base coupled to the output of the differential multiplier and the emitter coupled to the collector of the second transistor;

a fourth bipolar transistor having a base, an emitter and a collector, the base coupled to the output of the differential amplifier, the emitter coupled to the emitter of the third transistor;

a fifth transistor having a base, a emitter and a collector, the emitter coupled to ground, the base coupled to the collector, and the collector coupled to the collector of the third transistor; and a sixth transistor having a base, an emitter and a collector, the base coupled to the base of the fifth transistor, the emitter coupled to ground and the collector coupled to the collector of the fourth transistor;

whereby the output correction current is provided at the collector of the sixth transistor.

17. The device as recited in claim 16, wherein an emitter surface area of the third transistor is different from an emitter surface area of the fourth transistor.

18. The device as recited in claim 11, wherein the first correction reference signal is a predetermined mean value of the saw-tooth signal.

19. The device as recited in claim 12, wherein the second correction reference signal is a predetermined maximum value of the saw-tooth signal.

20. A cathode-ray tube having a saw-tooth signal to control a vertical scanning operation of an electron beam and including a device to correct a ramp of the saw-tooth signal, the device comprising:

a first voltage-to-current converter to receive the saw-tooth signal and output first and second differential currents as a function thereof, a difference between the first and second differential currents having a mean value of zero;

a second voltage-to-current converter to receive a predetermined reference voltage and to output third and fourth differential currents as a function thereof, a difference between the third and fourth differential currents being proportional to the predetermined reference voltage;

a differential multiplier to receive the first, second, third and fourth differential currents and output a differential voltage as a function thereof; and a transconductance amplifier to receive the differential voltage and output a correction current to correct the ramp of the saw-tooth signal.

21. The cathode-ray tube as recited in claim 20, wherein the rectifier receives a first correction reference signal, the first and second differential currents being a function thereof; and the first connection reference signal representative of a characteristic of the cathode-ray tube.

22. The cathode-ray tube as recited in claim 20, wherein the saw-tooth signal is provided on a capacitor charged by a charging current supplied a current source, the device further comprising:

a bias current circuit to supply a bias current to the transconductance amplifier as a function of the charging current supplied to the capacitor.

23. A method of correcting a ramp of a saw-tooth signal on a capacitor being charged by a charging current provided by a current source in a cathode-ray tube, the saw-tooth signal controlling a vertical deflection of an electron beam, the method comprising steps of:

(A) converting the saw-tooth signal into first and second differential currents, a difference between the first and second differential currents having a mean value of zero;

(B) converting a predetermined reference voltage to third and fourth differential currents, a difference between the third and fourth differential currents proportional to the predetermined reference voltage;

(C) multiplying the first, second, third and fourth differential currents by one another and converting the product into a differential voltage;

(D) converting the differential voltage into a correction current; and (E) coupling the correction current to the charging current to correct the ramp.

24. The method as recited in claim 23, wherein step D comprises a step of:

providing the differential voltage to a transconductance amplifier.

25. The method as recited in claim 23, wherein step A comprises a step of:

converting and rectifying the saw-tooth signal into first and second differential currents as a function of at least one correction reference signal, the at least one correction reference signal proportional to a characteristic of the cathode-ray tube.

26. The method as recited in claim 23, wherein step A comprises a step of:

converting the saw-tooth signal into first and second differential currents as a function of at least one correction reference signal, the at least one correction reference signal proportional to a characteristic of the cathode-ray tube.

27. The method as recited in claim 24, wherein step D further comprises a step of:

biasing the transconductance amplifier as a function of the charging current.

28. The method as recited in claim 23, wherein step C comprises a step of referencing the differential voltage to a positive supply voltage.

29. The method as recited in claim 23, further comprising a step of:

providing the predetermined reference voltage according to a characteristic of the cathode-ray tube.

30. The method as recited in claim 25, further comprising a step of:

providing the at least one correction reference signal proportional to a maximum allowed amplitude of the saw-tooth signal.

31. The method as recited in claim 25, further comprising a step of:

providing the at least one correction reference signal proportional to a mean amplitude of the saw-tooth signal.

* * * * *